United States Patent [19]

Stut

[11] 4,092,124
[45] May 30, 1978

[54] APPARATUS FOR FLOATING MELT ZONE PROCESSING OF A SEMICONDUCTOR ROD

[75] Inventor: Hans Stut, Groebenzell, Germany

[73] Assignee: Siemens Aktiengesellschaft, Berlin & Munich, Germany

[21] Appl. No.: 707,957

[22] Filed: Jul. 23, 1976

[30] Foreign Application Priority Data

Jul. 29, 1975 Germany .............................. 2533858

[51] Int. Cl.² .............................................. B01J 17/10
[52] U.S. Cl. .................................. 23/273 R; 156/620;
13/DIG. 1; 23/273 SP
[58] Field of Search ...................... 23/273 SP, 273 Z;
156/620; 13/DIG. 1

[56] References Cited

U.S. PATENT DOCUMENTS

| 2,976,339 | 3/1961 | Gruber | 13/33 |
|---|---|---|---|
| 3,391,235 | 7/1968 | Emeis | 23/273 Z |
| 3,622,280 | 11/1971 | Keller | 156/620 |
| 3,630,684 | 12/1971 | Keller | 23/273 Z |
| 3,650,700 | 3/1972 | Erneis | 23/273 Z |
| 3,685,973 | 8/1972 | Keller | 23/273 Z |

FOREIGN PATENT DOCUMENTS

| 1,074,488 | 7/1967 | United Kingdom | 156/620 |
|---|---|---|---|
| 1,361,710 | 7/1974 | United Kingdom | 156/620 |

OTHER PUBLICATIONS

Lawson, Preparation of Single Crystals, London, 1958, p. 67.

Primary Examiner—Stephen J. Emery
Attorney, Agent, or Firm—Hill, Gross, Simpson, Van Santen, Steadman, Chiara & Simpson

[57] ABSTRACT

An apparatus for floating melt zone processing of a semiconductor rod including an axially fixed induction heating coil wherein the heating coil is attached to a horizontal shift means having an amplitude sufficiently great to move the coil away from the rod during insertion and/or removal of the rod in the apparatus.

1 Claim, 1 Drawing Figure

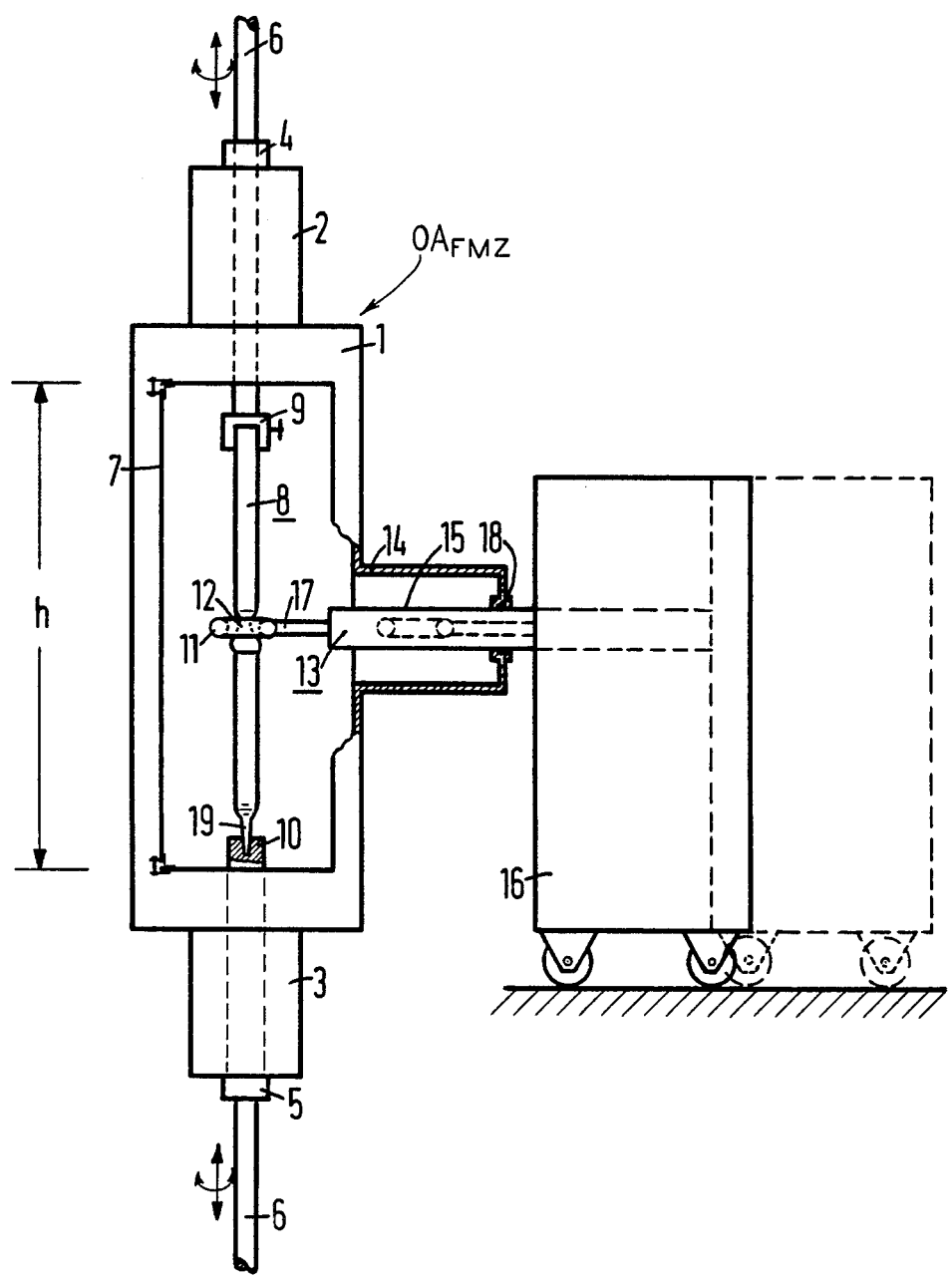

APPARATUS FOR FLOATING MELT ZONE PROCESSING OF A SEMICONDUCTOR ROD

BACKGROUND OF THE INVENTION

1. Field of the Invention

The invention relates to floating melt zone processing of semiconductor rods and somewhat more particularly to an apparatus for the floating melt zone processing of semiconductor rods which include an axially fixed induction heating coil.

2. Prior Art

Apparatuses are known for the floating melt zone processing of semiconductor rods wherein the rod to be processed is positioned vertically between a pair of opposing rod support means within a housing having an induction heating coil positioned to annularly encompass a zone on the rod and which upon energization produces a melt zone on the rod, along with a high frequency generator coupled to the coil via a high-frequency cable. The rod support means and the heating coil are, in these type of apparatuses, movable relative to one another.

For example, German Pat. No. 1,138,375 or U.S. Pat. No. 3,160,478 describe devices of this type. The devices there described are used for changing a rod cross-section as the rod is undergoing a floating melt zone process and to that end, the rod may be vertically mounted between the rod support means which are movable in relation to one another and to the heating coil, which is in a fixed position.

A semiconductor rod processed in such apparatuses can only be removed from the processing chamber via an access opening or the like therein which must be at least twice as high as the overall length of the rod. This type of processing device is shown in German Pat. No. 1,151,669 and in U.S. Pat. No. 3,189,415. However, such devices require very high access openings, particularly when relatively long rods (for example, having a length in excess of 1 meter) are to be melt zone processed and such high access opening containing devices are economically and technically difficult to produce.

SUMMARY OF THE INVENTION

The invention provides an apparatus for the floating melt zone processing of the type hereinbefore described wherein the heating coil is attached to a horizontal shift means having an amplitude of sufficient greatness to move the coil away from the semiconductor rod when desired.

By utilizing the principles of the invention, an apparatus is provided for melt zone processing of semiconductor rods which allows the rod to be inserted or removed therefrom via an access opening corresponding only to the length of the rod being treated.

In a preferred embodiment of the invention, a high-frequency generator means for energizing the heating coil is comprised within the horizontal shift means so as to be movable therewith.

In another preferred embodiment of the invention, the high-frequency generator means forms a structure unit with the heating coil so that only a very short high-frequency cable is required for coupling the coil with the generator means.

BRIEF DESCRIPTION OF THE DRAWINGS

The drawing illustrate, somewhat schematically, an apparatus constructed and operable in accordance with the principles of the invention, with portions thereof shown in phantom at alternate positions.

DESCRIPTION OF THE PREFERRED EMBODIMENTS

The invention provides an apparatus for the floating melt zone processing of relatively long semiconductor rods which avoids the prior art drawbacks and obviates the necessity of having very high access openings therein for insertion and/or removal of such rods.

In accordance with the principles of the invention, an apparatus for the floating melt zone processing of semiconductor rods, for example, composed of silicon or some other semiconductor material, is comprised of a housing having a processing chamber therein with a pair of opposing rod support means therein for vertically supporting a rod within such chamber and an axially (longitudinal axis) fixed induction heating coil positioned between the support means for annularly encompassing a zone of a rod mounted between such support means. A high-frequency generator means is coupled to the coil via a relatively short high-frequency cable and the rod support means are movable at least relative to the coil so that the entire length of the rod may be traversed by a melt zone generated by the energized coil.

In accordance with the principles of the invention, the induction heating coil is attached to a horizontal shift means having an amplitude of sufficient magnitude to move the coil away from the rod when desired. In this manner, a rod can be readily inserted or removed from the apparatus through an access opening corresponding only to the actual rod length.

In certain embodiments of the invention, a high-frequency generator means which energizes the heating coil is comprised within the horizontal shift means so that the generator means is movable with such shift means. In one form of this embodiment, the generator means forms a structural unit with the heating coil so that the length of the high-frequency cable coupling the coil with the generator means is maintained at a minimum.

Referring now to the drawing wherein a schematic illustration of an operational apparatus for the floating melt zone processing of a semiconductor rod is illustrated, with only such components thereof shown as is necessary for the understanding of the invention. As those in the art will appreciate, such an apparatus may include means for controlling the atmosphere about the rod being processed, means for moving the rod supports relative to the heating coil and/or to each other, means supplying energy to the heating coil and other energy-requiring components, means for sealing various openings within the apparatus, etc. However, since such components as well as others are more or less conventional and not essential for the understanding of the invention, they have been omitted and all such components will be referred to herein and in the claims merely as an operational apparatus $OA_{FMZ}$ for melt zone processing of semiconductor rods.

As shown, an apparatus of this type is comprised of a housing 1, composed, for example, of steel or some other rigid material, having an interior processing chamber and a pair of opposing tube-shaped extensions 2 and 3, respectively, which support through-guide means 4 and 5 for pulling shafts 6 attached thereto. The shafts 6 are movable at least in the directions indicated by the arrows adjacent each shaft via a suitable drive means (not shown) located outside the housing 1. The housing 1 includes an access opening 7 of a height h at a side wall thereof. As shown, the height dimension of access opening 7 is about equal to the axial length of a rod being processed so that a rod, such as rod 8, may be readily inserted or removed from the processing chamber as desired.

The semiconductor rod 8, for example, composed of silicon or some other semiconductor material, is positioned within the housing 1 so as to be vertically supported at the opposite ends thereof via support means 9 and 10. A seed crystal 19 may be fused to one end, for example, the lower end, of the rod 8 to aid in converting a polycrystalline rod into a monocrystalline rod via the melt zone process.

An induction heat coil 11 is positioned within the housing 1 so as to annularly encompass a zone on rod 8. Preferably, the coil 8 is comprised of a single-turn flat coil which is coupled to a movable high-frequency generator means 16 so that upon energization of the coil 11, a melt zone 12 is generated about the rod 8. The melt zone 12 is caused to travel the length of the rod, generally starting from the juncture of the seed crystal 19 and the end of the rod 8 attached thereto by appropriate movement of the rod support means 9 and 10. As shown, the coil 11 is mounted in an axially fixed position relative to the axial length of the rod 8 so that such coil may be referred to as comprising an axially fixed coil.

In the drawing, the melt zone is illustrated as being located in the approximate center of the rod 8, as when the melt zone process is about half complete.

The induction heating coil 11 is attached to a horizontal shift means 13 which has an amplitude of sufficient magnitude to move the coil away from the rod 8 when desired. The shift means 13 is positioned within a side tube 14 attached to a side wall of the housing 1. The side tube 14 includes a retaining ring chamber 18 filled with oil to provide a vacuum-tight sliding seal between the tube member and an arm member 15 thereby allowing the arm member 15 to move relative to the tube member 14. The arm member 15 is connected to the high-frequency cable 17 and to the coil 11 so as to move the coil between the solid line and broken line positions.

For example, when the shift means 13, which in a preferred embodiment may form a structural unit with the generator means 16, is in the broken line position, a rod may be inserted and/or removed from the processing chamber as desired. During the insertion of a rod, the rod 8 will be arranged above the coil 11 and during the removal thereof after completion of the process (pulling with a lower seed crystal 19), the rod will be arranged below the coil. The removal/insertion of a rod is effected by the separating and spreading movement of the rod support means and horizontal withdrawal of the coil 11 (which may be comprised of two crescent-shaped members selectively coupled together in an operational manner) via shift means 13 and moving the rod either from outside the housing upwardly into the center of the processing chamber or from inside the housing downwardly and out of the chamber in a simple manner. By utilizing the apparatus of the invention, semiconductor rods having lengths in excess of 1 meter may readily be melt zone processed since the access opening need only be of a length about equal to that of the rod length.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. In an operational apparatus for the floating melt zone processing of a vertically oriented semiconductor rod of the type including a housing defining a processing chamber therein, a pair of rod-support members positioned at opposite ends of said processing chamber for vertically supporting such semiconductor rod therebetween, means for vertically moving said rod-support members relative to said chamber, an induction heating coil located in an axially substantially fixed position within said processing chamber between said support members and adapted for annularly encompassing a zone of a rod mounted between said support members, a high-frequency generator means, and cable means coupling said heating coil and said generator means for supplying energy to said heating coil so as to generate a melt zone on such rod when such is being processed in said processing chamber, the improvement comprising in combination:

A. tube means associated sealingly with said housing and defining a transversely extending side chamber projecting from said processing chamber between said support members, said tube means having a lateral aperture defined therein;
  B. horizontally extending shift rod means, including fastening means functionally supporting said heating coil at a forward end thereof and also adapted to energize same, and further including seal means located slidably circumferentially thereabout and mounted about said aperture, so that a terminal opposed end of said shaft rod means is outside said side chamber;
  C. auxiliary supporting means located adjacent said housing and adapted to hold said generator means;
  D. supporting surface engaging roller means, including mounting means for joining said auxiliary supporting means and said roller means for transverse, reciprocal movements of said auxiliary supporting means towards and away from the lateral outside end of said tube means;
  E. said terminal opposed end being functionally connected with said generator means and adapted to be energized by same for operating said heating coil; and
  F. said heating coil, said shift rod means, and said auxiliary supporting means, and said generating means thereby being in a spatially substantially fixed interrelationship to one another and movable laterally and reciprocably as a unit relative to said housing.

* * * * *